United States Patent [19]

Beddingfield

[11] Patent Number: 5,726,502
[45] Date of Patent: Mar. 10, 1998

[54] BUMPED SEMICONDUCTOR DEVICE WITH ALIGNMENT FEATURES AND METHOD FOR MAKING THE SAME

[75] Inventor: Stanley C. Beddingfield, Austin, Tex.

[73] Assignee: Motorola, Inc., Schaumburg, Ill.

[21] Appl. No.: 638,095

[22] Filed: Apr. 26, 1996

[51] Int. Cl.⁶ .................................................. H01L 23/544
[52] U.S. Cl. ........................... 257/797; 257/737; 257/778
[58] Field of Search ................................. 257/737, 738, 257/778, 797

[56] References Cited

U.S. PATENT DOCUMENTS 5,214,308  5/1993  Nishiguchi et al. ................. 257/797

FOREIGN PATENT DOCUMENTS 4-102339  4/1992  Japan ................................. 257/797

OTHER PUBLICATIONS

"Motorola C4 Product Design Manual;" vol. 1: Chip and Wafer Design; ch. 6 (Unit Cell Design); pp. 6-1—6-24 (1993).

*Primary Examiner*—Jerome Jackson
*Assistant Examiner*—Nathan Kelley
*Attorney, Agent, or Firm*—Patricia S. Goddard; Jeffrey S. Abel

[57] ABSTRACT

A semiconductor device (30) includes a bumped semiconductor die (32) having a plurality of input/output (I/O) bumps (36) and a plurality of alignment bumps (38). Alignment bumps (38) are formed at the same time as I/O bumps (36) and are used by a vision system to properly align die (32) to a mounting substrate (34) for attachment thereto. Because the alignment bumps are smaller than the I/O bumps, the alignment bumps are not damaged during manufacturing operations such as wafer probe, burn-in, or test, and therefore maintain their original shape. The vision system can thus use the alignment bumps to repeatedly and accurately align the die to the mounting substrate, thereby eliminating misalignment caused by damage to the I/O bumps.

13 Claims, 3 Drawing Sheets

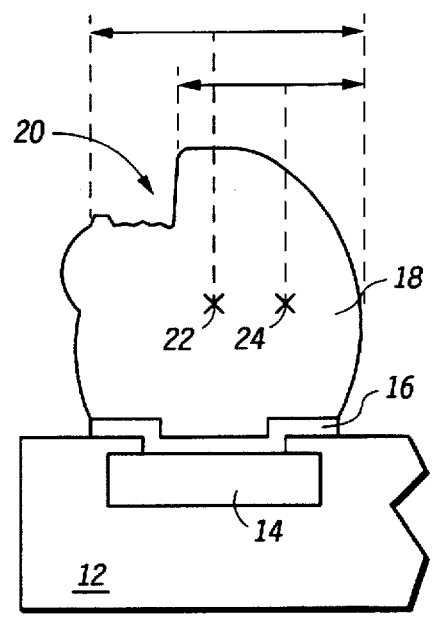
FIG.1
—PRIOR ART—
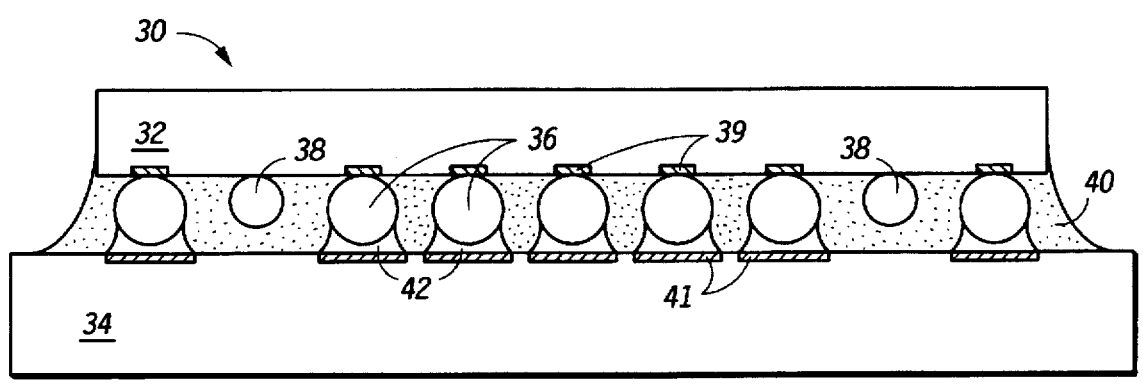
FIG.2
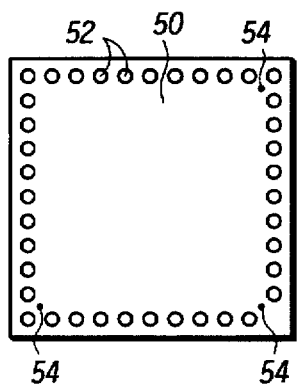 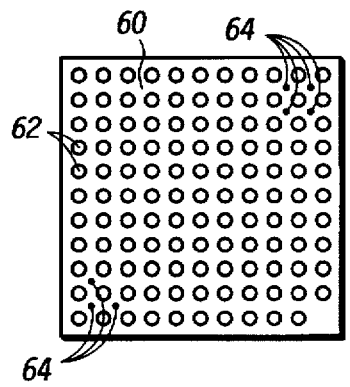 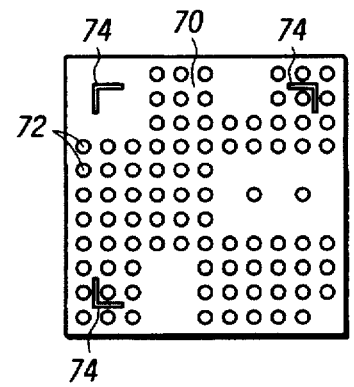
FIG.3  FIG.4  FIG.5

BUMPED SEMICONDUCTOR DEVICE WITH ALIGNMENT FEATURES AND METHOD FOR MAKING THE SAME

FIELD OF THE INVENTION

The present invention relates to bumped semiconductor devices in general, and more specifically to a way in which bumped semiconductor devices can be aligned to a mounting substrate despite there being damage to the bumps.

BACKGROUND OF THE INVENTION

Flip-chip semiconductor devices are finding more widespread use in the electronics industry since flip-chip mounting permits a higher component density and faster accessing times in systems than if conventionally packaged semiconductor devices are used. A flip-chip semiconductor device is one in which a semiconductor die is directly mounted to a mounting substrate, such as a ceramic or an organic printed circuit board. Conductive terminals on the semiconductor die, usually in the form of solder bumps, are directly physically and electrically connected to the wiring pattern on the mounting substrate without use of wire bonds, tape-automated bonding (TAB), or the like. Because the conductive bumps making connections to the substrate are on the active surface of the die or chip, the die is mounted in a face-down manner, thus the name flip-chip.

While flip-chip semiconductor devices are gaining popularity, a problem the industry is experiencing with flip chip devices relates to the alignment of the bumped die to the mounting substrate due to damage which may be done to the bumps. Typically, the bumps on semiconductor die are formed while the die are still in wafer form. While in wafer form, the die are probed for parametrics. Thereafter, the individual semiconductor die are singulated from the wafer form and undergo a process known as burn-in. During the burn-in process, bumped die may either be mounted into a burn-in socket where a physical force is exerted onto the die to make electrical contact between the bumps of the device and the socket contacts. Alternatively, the bumped die may be temporarily metallurgy joined to a burn-in substrate. After burn-in, or alternatively during burn-in, bumped devices may be finally tested for full functionality. During each of the probe, burn-in, and test processes, the bumps formed on the die may be physically damaged. Damage to the bumps is particularly likely in the burn-in process, which is performed at elevated temperatures, thereby weakening the mechanical strength of the bumps.

FIG. 1 illustrates a portion of a semiconductor die 12 having a bump which has been damaged in accordance with the prior art. Die 12 includes an input/output (I/O) pad 14. I/O pad 14 is electrically connected to integrated circuitry (not shown) of the die in a conventional manner. A layer of pad limiting metallurgy (PLM) 16 is formed over I/O pad 14 in accordance with a known method for forming conductive bumps on a semiconductor die. An I/O bump 18 is formed on PLM 16, as illustrated. As an example, I/O bump 18 may be a solder bump formed using a process known as Controlled Collapse Chip Connection (C4), wherein lead and tin are evaporated through a metal mask having openings which correspond to the I/O pad locations. In the C4 process, PLM 16 is typically a combination of chromium, copper, and gold, which are also evaporated through the same metal mask. After the evaporation of the lead and tin, the mask is removed and the bump metallurgy is reflowed, wherein the I/O bump takes on a spherical shape due to surface tension forces of the liquidous metallurgy. Upon cooling, the bump maintains this spherical shape. However, subsequent operations on the bump die, such as burn-in testing, can lead to damage 20 in one or all of the bumps of the die.

Damage 20 to I/O bump 18 is problematic when it comes to mounting semiconductor die 12 to a mounting substrate. In mounting the die to a substrate, proper alignment of the die to the substrate must be made. In many cases, this alignment is performed by a vision system which identifies pre-determined bumps on the semiconductor die, for example three I/O bumps located near each of three corners of the semiconductor die. Upon locating the three pre-determined bumps, the vision system calculates a center of each of these bumps, and from the pre-determined bumps' centers can determine the center and orientation of the semiconductor die to be mounted. The calculated center and orientation of the die is then used to determine the proper placement on the mounting substrate.

If the bump is damaged, however, at least two problems may occur. First, the vision system may not recognize a bump as such. A vision system is looking for a circular shape. If damage is severe enough, the vision system will be unable to recognize a damaged bump as a bump, and therefore will improperly reject the die. Second, damage to the bump may cause the vision system to miscalculate the center of the bump. For example in reference to FIG. 1, a true center 22 of I/O bump 18 is not calculated by the vision system due to damage 20. In determining the center of a bump, the vision system is looking for the outer edges of the bump and calculates the center as being the distance halfway between the outer edges of the bump. In reference to I/O bump 18 of FIG. 1, if the camera of the vision system is looking at the top of the bump, the center will be measured from the outer edge of damage 20 and not the outermost edge of the bump, resulting in a calculated center 24 which is incorrect. Because the center of the bump is miscalculated, the center and orientation of the semiconductor die will also be miscalculated, and upon mounting the die will be misaligned.

In the case of forming C4 bumps, one method for solving the problem damage to the bump imposes on the alignment process is to reflow the bumps after damage has occurred such that the bumps of the die again take on a more spherical shape. However, such reflow operations are impractical after the die have already been singulated from the wafer.

Accordingly, there exists a need for an improved mechanism for aligning a bumped semiconductor die to a mounting substrate which is independent of damage which may be formed to I/O bumps on the die.

BRIEF DESCRIPTION OF THE DRAWINGS

FIG. 1 is a partial view of a bumped semiconductor die illustrating damage which may be imposed upon the bumps from a burn-in process, or other process in which the bumps are physically contacted.

FIG. 2 is a cross-sectional illustration of a bumped semiconductor die attached to a mounting substrate using alignment bumps in accordance with the present invention.

FIGS. 3–5 illustrate various forms which alignment bumps can take, including different size, locations, shapes, and numbers, to facilitate alignment of a bumped die in accordance with embodiments of the present invention.

DETAILED DESCRIPTION OF A PREFERRED EMBODIMENT

Figure 6:
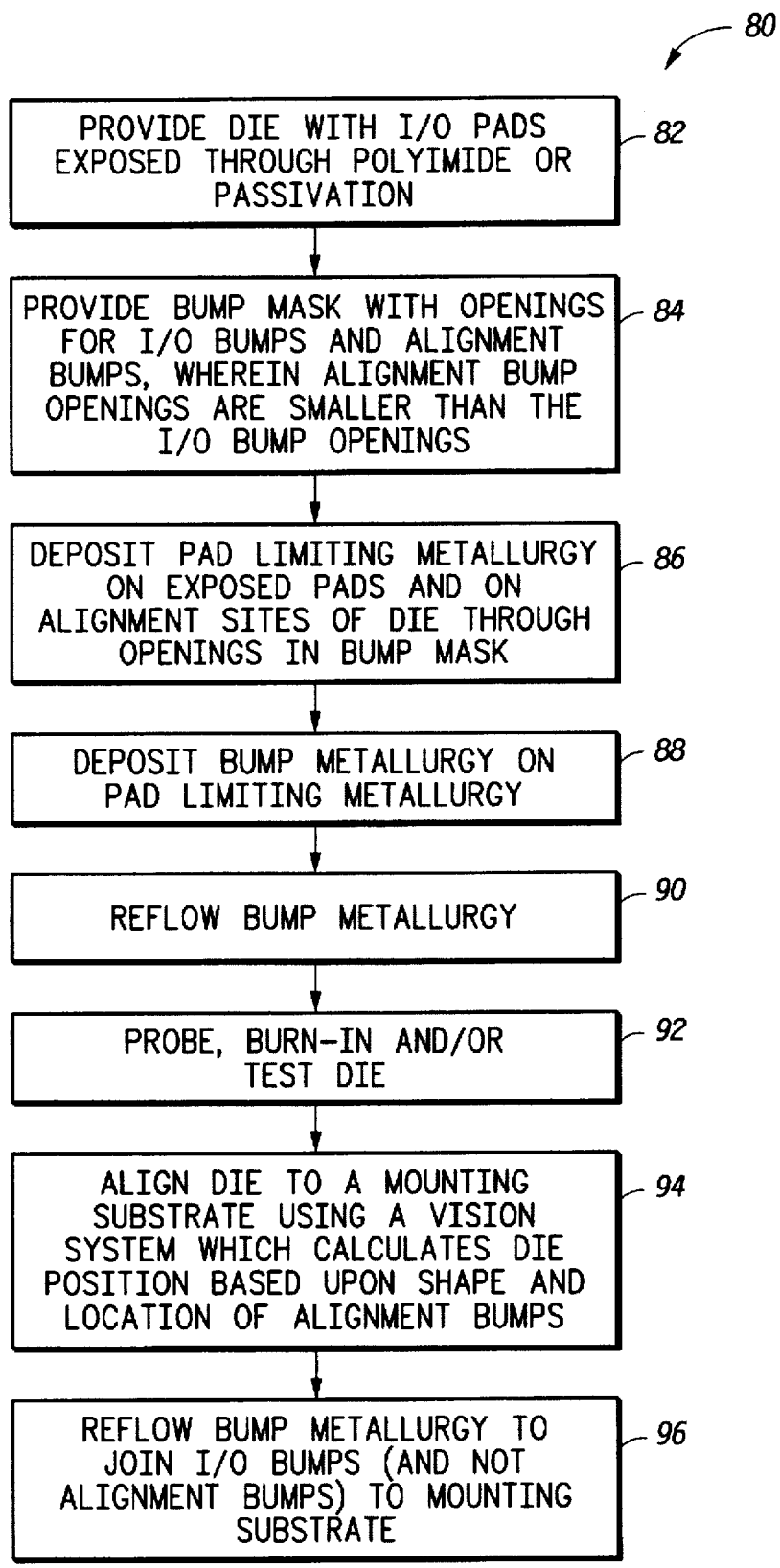
FIG. 6 is a process flow demonstrating how alignment bumps can be formed and utilized in accordance with one embodiment of the present invention.

Generally, the present invention utilizes dedicated alignment bumps formed on the active surface of a semiconductor die to facilitate the alignment of the die to a mounting substrate for subsequent attachment thereto. In a preferred form, the alignment bumps are formed at the same time that input/output (I/O) bumps on the die are formed. For example, in a method which relies upon evaporation of metal through a mask to form the I/O bumps, openings are provided in the mask for the formation of the alignment bumps as well. Accordingly, no additional processing steps are required to practice the present invention.

Another feature of the alignment bumps is that in a preferred embodiment of the invention the alignment bumps are made smaller than the I/O bumps such that the alignment bumps are not damaged during test or burn-in operations. For instance, alignment bumps may be formed to have a smaller size than the I/O bumps by making the openings in the evaporation mask for the alignment bumps smaller in diameter than the openings for the I/O bumps. Then, upon reflow, the alignment bumps become smaller in height than the I/O bumps. Because the alignment bumps are shorter, they are not contacted by any socket contacts or test pins, and are therefore not subject to mechanical damage. Since the alignment bumps are not damaged, their shape remains unchanged from the initial evaporation or solder reflow process, and a vision system can be used to accurately identify the alignment bumps and correctly determine the center thereof.

After aligning, the I/O bumps are bonded to corresponding pads on a mounting substrate, without the alignment bumps being bonded to pads on the mounting substrate. Thereafter, an underfill material is dispensed between the die and the mounting substrate. Because the alignment bumps are preferably made shorter than the I/O bumps, there will be sufficient room beneath the alignment bumps for the underfill material to flow, without creating voids which could lead to reliability problems.

These and other features and advantages of the present invention will be more clearly understood from the following detailed description taken in conjunction with the accompanying drawings. It is important to point out that the illustrations are not necessarily drawn to scale, and that there can be other embodiments of the invention which are not specifically illustrated. Further, it is noted that like reference numerals are sometimes used throughout the various views to denote identical or similar elements.

FIG. 2 is a cross-sectional illustration of a semiconductor device 30 which includes a semiconductor die 32 which has been flip-chip mounted to a mounting substrate 34 in accordance with the present invention. Semiconductor die can be any type of die, such as a memory, a microprocessor, an application specific integrated circuit, or the like. Mounting substrate 34 can be an organic substrate, such as a glass fiber reinforced epoxy or resin used for printed circuit boards or plastic ball grid array semiconductor packages. Alternatively, mounting substrate 34 could be an inorganic substrate, such as a glass substrate or multilayer ceramic substrate.

Formed on an active surface of die 32 (i.e. the side of the die on which active circuitry has been formed) is a plurality of I/O bumps 36 and a plurality of alignment bumps 38. Both I/O bumps 36 and alignment bumps 38 are preferably formed of solder, although the present invention is not limited to utilizing a particular material for the bumps. Naturally, I/O bumps 36 should be formed of a conductive material to enable electrical connection between a plurality of I/O pads 39 of the die and a plurality of conductive I/O pads 41 on the mounting substrate; however, there is no requirement of conductivity for alignment bumps 38. If formed of solder, I/O bumps 36 may be attached to mounting substrate 34 using a eutectic solder 42. If the bumps are formed using a C4 process, eutectic solder 42 is necessary to attach the die to an organic mounting substrate, wherein the eutectic solder 42 is first deposited on a surface of the mounting substrate. If the mounting substrate is a ceramic or another material which can withstand temperatures needed to reflow I/O bumps 36, then use of a lower temperature eutectic solder may not be needed.

As also illustrated in FIG. 2, alignment bumps 38 are made to be smaller than I/O bumps 36 in a preferred embodiment of the invention. The purpose of making the alignment bumps smaller than the I/O bumps is to prevent the alignment bumps from being damaged after formation. For instance, when testing or burning-in die 32, test contacts, probes, or socket contacts come into physical contact with I/O bumps 36, and therefore can mechanically damage the bumps. However, because alignment bumps are made smaller than I/O bumps 36, the test, probe, or burn-in contacts will never contact alignment bumps 38. Accordingly, alignment bumps 38 will not be damaged and will retain their spherical shape throughout the assembly process. Because their original shape is maintained, alignment bumps 38 can be used by a vision system to properly align die 32 with respect to mounting substrate 34 without the vision system mistaking the center of the alignment bumps or their presence. Furthermore, an advantage of making alignment bumps 38 sufficiently small is that upon dispensing an underfill material 40, the underfill material can adequately fill in the gap between alignment bumps 38 and mounting substrate 34 to prevent undesirable voids in the underfill material.

FIGS. 3-5 illustrate examples of where alignment bumps can be placed on the active surface of the die, and what configuration the alignment bumps can take to facilitate the alignment process. In each of the figures, the view of the die is that of the active surface of the die, or in other words the surface upon which the conductive bumps will be formed and which will be placed adjacent to a mounting substrate.

FIG. 3 illustrates a semiconductor die 50 having a plurality of I/O bumps 52 arranged in a configuration around the periphery of the active surface of the die. In accordance with the present invention, die 50 also includes a plurality of alignment bumps 54 on the active surface. In a preferred embodiment, alignment bumps 54 are located at or near corners of the semiconductor die. Furthermore, it is preferred that alignment bumps 54 are placed at or near three corners of the semiconductor die. If an alignment bump were placed at only one corner, the semiconductor die could be misaligned in both the X and Y directions. If alignment bumps are symmetrically placed at either two or four corners of the semiconductor die, the semiconductor die could inadvertently be rotated, and the vision system would recognize the alignment bumps as being properly located and attempt to place the die despite its rotated positioning. Alignment bumps at two or four corners of the die could be utilized if the alignment bumps were positioned asymmetrically around the die perimeter, such that a vision recognition system could detect if the die was improperly rotated, as is apparent below in reference to FIG. 4.

FIG. 4 illustrates a semiconductor die 60 having a plurality of I/O bumps 62 configured in a regularly spaced array across the active surface of the die. Die 60 also includes a plurality of alignment bump 64 located at or near corners of the semiconductor die and formed in interstitial locations within the array. However, it is understood that alignment bumps could instead be located in positions of the array itself (e.g. as part of a row or column of I/O bumps). Furthermore, I/O bumps need not be formed in a regularly spaced array to appreciate the advantages of the present invention. As distinguished from alignment bumps 54 in FIG. 3, alignment bumps 64 of FIG. 4 are configured such that more than one individual alignment bump is located at or near each of two corners of the die. Specifically as illustrated, there are three alignment bumps associated with one corner of the semiconductor die and four alignment bumps associated with an opposing corner of the die. Because the configuration of the alignment bumps in the two corners is different (i.e. asymmetric), there is no need to have alignment bumps at or near a third corner of the die.

FIG. 5 illustrates yet another embodiment in which a semiconductor die 70 includes a plurality of alignment features 74 which are not in the shape of circular or spherical bumps, but instead have an L-shape. Alignment features 74 demonstrate that the particular perimeter shape of the alignment features need not be the same as that of the I/O bumps, provided that there is a distinguishing physical feature between the alignment features and the I/O bumps for a vision system to recognize. Moreover, alignment features 74 should preferably also have a height differential from I/O bumps 72 of die 70 so that the alignment features are not damaged during burn-in or testing operations, such as the height differential depicted previously in FIG. 2. Alignment features 74 not in the shape of spherical bumps can nonetheless be formed at the same time that I/O bumps 72 are formed, simply by including openings in the masks used for forming the I/O bumps which take the shape of the desired alignment feature. For example, a mask used to form I/O bumps 72 would also include openings having an L-shape such that evaporation or deposition of metal through the mask results in the formation of L-shaped alignment feature 74. To achieve a height differential as compared to the I/O bumps, the L-shaped openings in the mask for the alignment bumps should be made narrower than the openings used to form the I/O bumps. Die 70 also demonstrates that the configuration of I/O bumps 72 need not be in a peripheral or regularly spaced array to benefit from the present invention.

FIG. 6 illustrates a process flow 80 which can be used for forming alignment bumps or features in accordance with one embodiment of the present invention. Process flow 80 begins with a step 82 of providing a semiconductor die with exposed I/O pads. The I/O pads will typically be exposed through openings formed in a polyimide or passivation layer which has been formed on the active surface of the semiconductor die. For example, in reference to FIG. 7, a semiconductor die 100 includes an I/O pad 102 which is exposed through an opening in a polyimide or passivation layer 103. I/O pads on the die must be exposed so that metal which is deposited on the die to form the I/O bumps is in electrical contact with the I/O pads, and therefore with the integrated circuitry of the die. Polyimide or passivation layer 103 is not limited to such materials, but is likely to be the outermost dielectric layer on the semiconductor device prior to bump formation.

Figure 7:
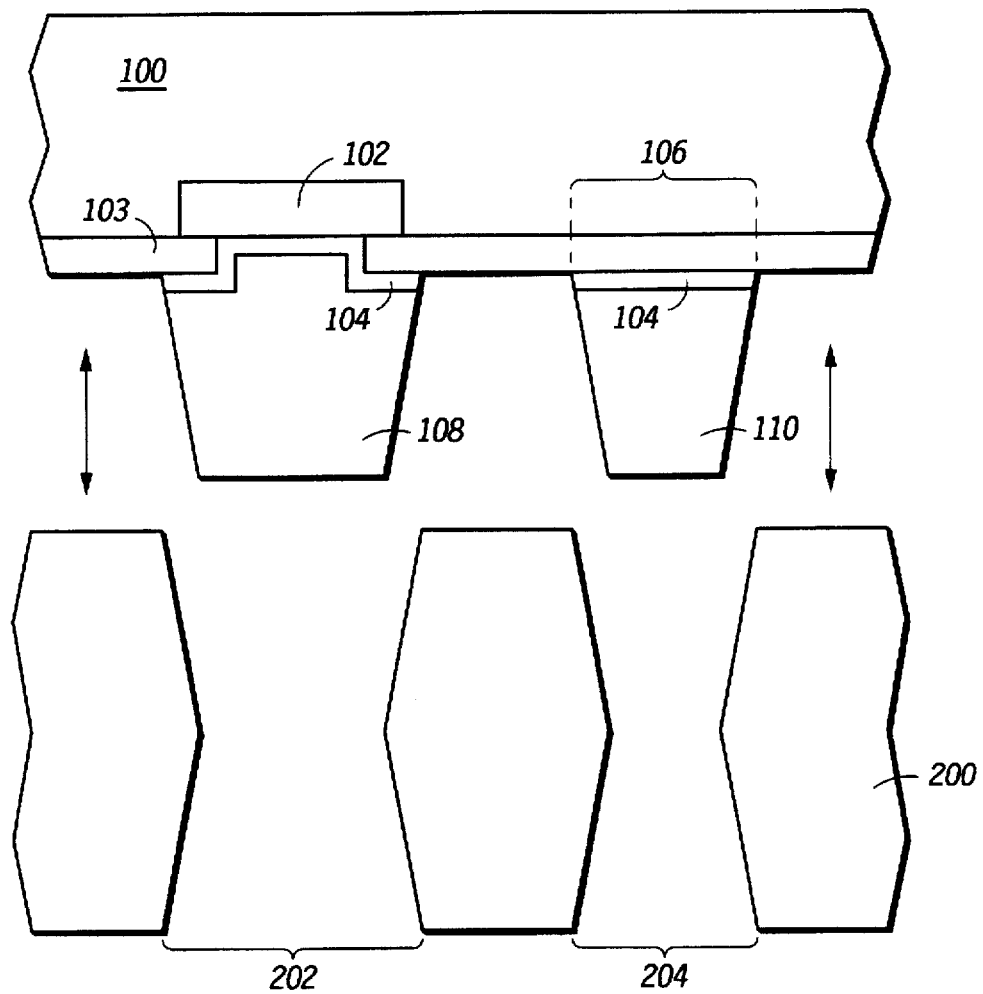
FIG. 7 illustrates in cross-section a portion of a semiconductor die having both an alignment bump and an I/O bump formed as a result of metal evaporation through a mask in accordance with one process of the present invention.

Next, a step 84 involves providing a bump mask that includes openings for both I/O bumps and alignment bumps to be formed. If using an evaporative method to deposit the bumps, a mask, such as metal mask 200 of FIG. 7, is positioned adjacent to the active surface of the semiconductor die. Metal mask 200 includes an I/O opening 202 and an alignment opening 204 through which metal is evaporated onto the semiconductor die. If the bumps are formed using a plating process, rather than utilizing metal mask 200, a photo-imagable mask would be formed directly on the active surface of the die, and photolithographically patterned and developed to create openings in the photo-imagable mask analogous to I/O opening 202 and alignment opening 204. It is noted that in actual formation of the bump metallurgy, die 100 will most likely be positioned with the active side facing up and the mask positioned above the die. The orientation illustrated in FIG. 7 is used for clarity in comparing the bump formation process to the final bump shape shown in FIG. 8.

Regardless of the type of mask or deposition process used to form the bumps, a common feature of a mask used in accordance with process flow 80 is that openings formed in the mask to define alignment bumps are smaller than openings formed in the mask to define I/O bumps. For example in reference to FIG. 7, alignment opening 204 is smaller than I/O opening 202. As illustrated, alignment opening is smaller in diameter than the I/O opening. For example, I/O opening 202 can be made to have an outer diameter of 0.1270 millimeter (mm), while alignment opening 204 can be made to have an outer diameter of 0.0762 mm. As also illustrated, the alignment opening 204 and I/O opening 202 have a same height. However, this does not mean that alignment bumps will necessarily have the same height as the I/O bumps in a finished semiconductor device, as will be apparent below.

After providing a bump mask, a next step is to deposit the metallurgy or provide the desired conductive material in the mask openings. In an evaporative process, a pad limiting metallurgy is first deposited through the bump mask openings in a step 86 of process flow 80. To do so, the mask is placed or formed against the active surface of the die, and the metallurgy is provided through the mask openings. In reference to FIG. 7, a pad limiting metallurgy (PLM) 104 is deposited on the active surface of die 100 in locations corresponding to I/O opening 202 and alignment opening 204 of mask 200. It is noted that in one instance, the PLM is deposited on an exposed I/O pad 102, but in another instance, the PLM is deposited on polyimide or passivation layer 103 at an alignment bump site 106. This difference is due to the fact that an alignment bump made in accordance with the present invention is not electrically coupled to the semiconductor die or to the integrated circuitry formed thereon. Accordingly, there is no need for any metallization beneath an alignment bump, other than perhaps pad limiting metallurgy 104 which is used for adhering the bulk bump metallurgy to the polyimide or passivation surface.

Once the PLM is deposited, if needed, the bulk of the bump metallurgy is then deposited through the openings of the mask in a step 88 of process flow 80. In a preferred embodiment, the bulk metallurgy is that needed to form a solder composition. In the case of a C4 deposition, the bump metallurgy will consist of evaporation of tin and lead in a ratio sufficient to form a solder bump having a composition of approximately 97% lead and 3% tin after full reflow of the C4 bumps.

After the bulk bump metallurgy is presented onto the die, the mask is removed by physical lift-off, in the case of evaporative deposition, or by chemical dissolution in the case of plating. As a result an I/O bump 108 and an alignment bump 110 are formed on I/O pad 102 and alignment site 106 respectively, as illustrated in FIG. 7. Both I/O bump 108 and alignment bump 110 take the shape of a truncated cone due to the shape of the openings in mask 200. Both bumps have a same height since both undergo evaporation for a same length of time. A difference however, is that alignment bump 110 is narrower than I/O bump 108, due to the difference in sizes of alignment opening 204 and I/O opening 202 in mask 200. I/O bump 108 and alignment bump 110 will have approximately the same lateral dimensions as the openings in the mask. For example, I/O bump 108 will have a base diameter of 0.1270 mm and alignment bump 110 will have a base diameter of 0.0762 mm. How these differences in physical size affect the shape of the alignment and I/O bumps in the final device is discussed below.

Figure 8:
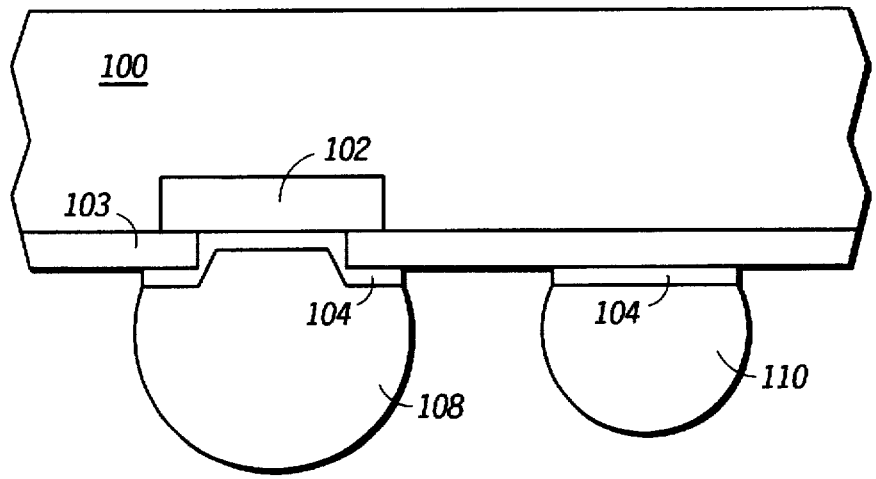
FIG. 8 illustrates in cross-section the I/O bump and alignment bump of FIG. 7, after the bumps have undergone a reflow operation.

A next step in process flow 80 is a step 90 of reflowing the bump bulk metallurgy, if the metallurgy is that used to form C4 or plated bumps. C4 bumps require a reflow operation so that the evaporated lead and tin metal form a more uniform solder composition. Upon reflowing, the C4 or plated bumps will take on a spherical shape as illustrated in FIG. 8. It is during this reflow operation that the initial difference in the diameter or width of I/O bump 108 and alignment bump 110 also becomes a height differential in the two bumps. In reference to FIG. 8, I/O bump 108 has a first height, while alignment bump 110 has a second height which is substantially different, and more precisely substantially smaller than the first height. Even though I/O bump 108 and alignment bump 110 initially had a same height after evaporation or plating, upon reflow the bumps will take on a spherical shape. Because the volume of metal in each of the two bumps is different, the resulting radius and diameter (or height) of the bumps will likewise differ. As an example, if I/O bump 108 is formed to have a base diameter of 0.1270 mm and alignment bump 110 is formed to have a base diameter of 0.0762 mm (with both bumps having an initial height 0.1118 mm), then upon reflow the I/O bump 108 will have a diameter (or height) of 0.0987 mm while the alignment bump 110 will have a diameter (or height) of 0.0770 mm. Thus, a height differential of about 0.0217 mm or close to 1 mil is created by the reflow process.

After forming the bumps, and reflowing the bumps in the case of C4 or plated bulk metallurgy, the die is then be subjected to conventional post-bump manufacturing, including wafer probe, burn-in, and testing of the semiconductor die, as indicated in a step 92 of process flow 80. During each of the post-bump processing steps, the alignment bumps, such as alignment bump 110, are shielded from mechanical damage due to their smaller size (particularly, smaller height) as compared to the I/O bumps. Accordingly, the alignment bumps maintain their shape as originally formed, and as shown in FIG. 8.

After the probing, burn-in, and testing of the die is completed, the die is ready for attachment to a mounting substrate. In order to properly attach the die, the die must be aligned such that the I/O bump configuration matches an I/O pad configuration on the mounting substrate. As in a conventional process, the die alignment used in accordance with the present invention is performed by a vision system which determines the proper die alignment based upon the shape and location of the alignment bumps included on the die, as indicated in a step 94 of process flow 80. The vision system will typically include a software program which calculates the die center and orientation based upon the shape and location of the alignment bumps, and therefore can position the die appropriately on the mounting substrate. If properly aligned, the I/O bumps on the semiconductor die will match the I/O pads on the mounting substrate, and the die can be joined to the mounting substrate by a reflow or heating operation as indicated in a step 96 of process flow 80.

In the case of attaching C4 bumps to an organic substrate, a lower temperature eutectic solder is preferably deposited on the I/O pads of the mounting substrate because the temperature at which C4 bumps are reflowed is too high for an organic substrate to withstand. In the case of attaching C4 bumps to a glass or ceramic substrate, use of a lower temperature eutectic solder is not needed. Regardless of the type of substrate, the reflow operation is designed to from a metallurgy bond between the I/O bumps on the die and the I/O pads on the mounting substrate. As a result, the I/O bumps will be physically and electrically connected to the I/O pads. However, during the reflow process to attach the die to the mounting substrate, the alignment bumps do not physically contact the mounting substrate due to their smaller size. For example, as illustrated in FIG. 2, the alignment bumps are shorter than the I/O bumps, such that even during a reflow operation, the alignment bumps will not physically contact the mounting substrate. Accordingly, the alignment bumps are not electrically connected to the mounting substrate, nor in direct physical contact therewith.

After attachment of the die to the mounting substrate, an underfill material, such as underfill material 40 shown in FIG. 2, can be dispensed between the die and the mounting substrate to improve the mechanical integrity of the device. The presences of alignment bumps or features to the die surface will not interfere with the underfill process because the size of the bumps is kept small enough to enable the underfill material to flow beneath the alignment features, thereby preventing void formation in the underfill material.

The foregoing description and illustrations contained herein demonstrate many of the advantages associated with the present invention. In particular it has been revealed that a process for aligning a bumped semiconductor die to a mounting substrate is enhanced with the present invention because it is independent of damage which may be formed to the I/O bumps of the die. More specifically, alignment bumps are included on the die which are not subjected to physical damage, and which maintain their original shape such that a vision based alignment system can repeatedly and accurately recognize the alignment bumps and therefore accurately align the semiconductor die. In addition to improving die alignment, the present invention also minimizes the chances that a vision system will improperly reject a die simply because the system does not recognize a damaged bump as a bump. Thus, the present invention results in a reduction in manufacturing cycle time for the die attachment process. While enhancing the alignment process, the use of the present invention does not add additional processing steps to the assembly operations, for the alignment bumps are formed at the same time that the I/O bumps are formed, requiring only a change in the mask design used to form the bumps. Furthermore, the presence of alignment bumps does not impede the attachment process of the semiconductor die to a mounting substrate. By making the alignment bumps smaller (e.g. in height) an underfill material can completely fill the die without risk of voiding.

Thus, it is apparent that there has been provided in accordance with the present invention a bumped semiconductor device having die alignment features and a method for forming the same that meets the needs and advantages set forth previously. Although the invention has been described and illustrated with reference to specific embodiments, it is not intended that the invention be limited to these illustrative embodiments. Those skilled in the art will recognize that modifications and variations can be made without departing from the spirit of the invention. For example, the present invention is not limited to any particular number of alignment bumps, shape of alignment bumps, or location of alignment bumps. Instead, the alignment bumps should substantially maintain their originally formed shape or reflow shape and not experience the extent of physical damage that I/O bumps experience. While it is preferred that the alignment bumps are formed simultaneously with the I/O bumps for an integrated manufacturing process, such is not a requirement of the present invention. Nor is it a requirement that the alignment bumps be formed of a same material as the I/O bumps. Moreover, it is not a requirement that I/O bumps formed on the semiconductor die be formed of solder. For example conductive polymers, conductive epoxies, gold, and other materials suitable for forming conductive bumps are within the scope of the present invention. In addition, the present invention is not limited to any particular method for providing the bump and alignment features. For example, evaporation, electrolytic plating, electroless plating, solder jet deposition, solder screening, and the like are all suitable methods for forming bumps and alignment features in accordance with the present invention. Therefore, it is intended that this invention encompass all such variations and modifications as fall within the scope of the appended claims.

I claim:

1. A semiconductor device comprising:

a semiconductor die having a plurality of I/O bumps and a plurality of alignment features formed on an active surface of the semiconductor die, each of the plurality of I/O bumps having an I/O bump size and each of the plurality of alignment features having an alignment feature size, wherein the alignment feature size is smaller than the I/O bump size in at least one dimension, thereby defining a size differential; and a mounting substrate, the semiconductor die being mounted to the mounting substrate such that the plurality of I/O bumps is in physical contact with a surface of the mounting substrate and the plurality of alignment features is physically isolated from the surface of the mounting substrate.

2. The semiconductor device of claim 1 wherein the I/O bump size is an I/O bump height measured relative to the active surface of the semiconductor die, the alignment feature size is an alignment feature height measured relative to the active surface of the semiconductor die, and the size differential enables the semiconductor die to undergo post-bump manufacturing operations without subjecting the plurality of alignment features to physical damage and enables a die orientation to be accurately determined using the plurality of alignment features.

3. A semiconductor device comprising:

a semiconductor did having a plurality of I/O bumps and a plurality of alignment features formed on an active surface of the semiconductor die, each of said plurality of I/O bumps having an I/O bump size and each of said plurality of alignment features having an alignment feature size, wherein the alignment feature size is smaller than the I/O bump size in at least one dimension, thereby defining a size differential; and a mounting substrate having a plurality of conductive pads, wherein the semiconductor die is mounted to the mounting substrate such that the plurality of I/O bumps is electrically connected to the plurality of conductive pads and the plurality of alignment features is electrically isolated from all conductive pads of the mounting substrate.

4. The semiconductor device of claim 2 wherein each of the plurality of I/O bumps and each of the plurality of alignment features comprises substantially the same material.

5. The semiconductor device of claim 4 wherein the material comprises solder.

6. The semiconductor device of claim 1 wherein the semiconductor die comprises four corner areas, and the plurality of alignment features comprises at least three alignment features, each of the at least three alignment features being located in a different one of the four corner areas.

7. The semiconductor device of claim 6 wherein each of the at least three alignment features comprises a group of alignment features which includes a plurality of individual alignment features.

8. A semiconductor device of claim 1 wherein the plurality of alignment features comprises a plurality of bumps similar in shape to the plurality of I/O bumps.

9. A semiconductor device comprising:

a semiconductor die having a plurality of I/O bumps and a plurality of alignment features which extend above an active surface of the semiconductor die; and a mounting substrate having a plurality of I/O pads formed on a die receiving surface of the mounting substrate;

wherein the semiconductor die is mounted on the die receiving surface of the mounting substrate such that the plurality of I/O bumps is in physical and electrical contact with the plurality of I/O pads of the mounting substrate, and the plurality of alignment features is physically and electrically isolated from all of I/O pads of the mounting substrate.

10. The semiconductor device of claim 9 wherein the plurality of alignment features comprises a plurality of alignment bumps similar in shape to the plurality of I/O bumps but different in size.

11. The semiconductor device of claim 10 wherein the plurality of alignment bumps and the plurality of I/O bumps both comprise bumps formed of solder.

12. The semiconductor device of claim 9 wherein the plurality of alignment features has a first height measured from an active surface of the semiconductor die and the plurality of I/O bumps has a second height measured from the active surface of the semiconductor die, and the second height is larger than the first height.

13. The semiconductor device of claim 9 wherein the semiconductor die comprises four corner areas, and at least one alignment feature of the plurality of alignment features is positioned in each of at least three of the four corner areas of the semiconductor die.

* * * * *

UNITED STATES PATENT AND TRADEMARK OFFICE
CERTIFICATE OF CORRECTION

PATENT NO. : 5,726,502
DATED : March 10, 1998
INVENTOR(S) : Stanley Craig Beddingfield It is certified that error appears in the above-identified patent and that said Letters Patent is hereby corrected as shown below:

Column 9, line 56: Change "did" to - die-

Column 10, line 42: Delete "of"

Signed and Sealed this

Thirteenth Day of October 1998

Attest:

BRUCE LEHMAN

Attesting Officer

Commissioner of Patents and Trademarks